US011328763B2

(12) United States Patent
Im

(10) Patent No.: US 11,328,763 B2
(45) Date of Patent: May 10, 2022

(54) VOLTAGE SUPPLY CIRCUIT FOR SUPPLYING A DRIVING VOLTAGE TO A SENSE AMPLIFYING CIRCUIT OF A SEMICONDUCTOR MEMORY DEVICE

(71) Applicant: SK hynix Inc., Gyeonggi-do (KR)

(72) Inventor: Jong Man Im, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/039,118

(22) Filed: Sep. 30, 2020

(65) Prior Publication Data
US 2021/0366533 A1 Nov. 25, 2021

(30) Foreign Application Priority Data

May 19, 2020 (KR) ........................ 10-2020-0059628

(51) Int. Cl.
| G11C 5/14 | (2006.01) |
| G11C 11/4091 | (2006.01) |
| G11C 11/4094 | (2006.01) |
| G11C 11/4074 | (2006.01) |
| H03K 19/20 | (2006.01) |

(52) U.S. Cl.
CPC .......... *G11C 11/4091* (2013.01); *G11C 5/147* (2013.01); *G11C 11/4074* (2013.01); *G11C 11/4094* (2013.01); *H03K 19/20* (2013.01)

(58) Field of Classification Search
CPC ............ G11C 11/4091; G11C 11/4094; G11C 11/4074; G11C 5/147
See application file for complete search history.

(56) References Cited

U.S. PATENT DOCUMENTS

| 6,452,859 B1 * | 9/2002 | Shimano .................. G11C 8/08 365/230.06 |
| 7,675,798 B2 * | 3/2010 | Song .................... G11C 11/4091 365/205 |
| 7,751,268 B2 * | 7/2010 | Park ......................... G11C 7/08 365/205 |
| 9,117,545 B1 * | 8/2015 | Kim .................... G11C 11/4091 |
| 2004/0233754 A1 * | 11/2004 | Kwon .................... G11C 7/065 365/205 |
| 2007/0070726 A1 * | 3/2007 | Jang ....................... G11C 7/065 365/189.11 |
| 2007/0195624 A1 * | 8/2007 | Song ........................ G11C 7/12 365/205 |
| 2016/0285372 A1 * | 9/2016 | Jang ....................... G11C 5/147 |

* cited by examiner

*Primary Examiner* — Mushfique Siddique
(74) *Attorney, Agent, or Firm* — IP & T Group LLP

(57) ABSTRACT

A semiconductor memory device includes a common driver suitable for generating a preliminary driving signal according to a voltage at a first node; and a plurality of individual drivers suitable for providing a core voltage to a sense amplifying circuit of a corresponding one of a plurality of cell mats, according to the preliminary driving signal, wherein each of the individual drivers includes: a level shifting circuit suitable for outputting a main driving signal by shifting a level of the preliminary driving signal when a corresponding mat select signal and a pull-up driving signal are activated; a pull-up driver suitable for driving a pull-up power line with the core voltage according to the main driving signal; and a switch suitable for coupling the first node to the pull-up power line when the corresponding mat select signal and the pull-up driving signal are activated.

13 Claims, 10 Drawing Sheets

VOLTAGE SUPPLY CIRCUIT FOR SUPPLYING A DRIVING VOLTAGE TO A SENSE AMPLIFYING CIRCUIT OF A SEMICONDUCTOR MEMORY DEVICE

CROSS-REFERENCE TO RELATED APPLICATION

This application claims priority under 35 U.S.C. § 119(a) to Korean Patent Application No. 10-2020-0059628, filed on May 19, 2020, the disclosure of which is incorporated herein by reference in its entirety.

BACKGROUND

1. Field

Various embodiments of the present invention generally relate to a semiconductor design technique, and more particularly to a voltage supply circuit for supplying a driving voltage to a sense amplifying circuit of a semiconductor memory device.

2. Description of the Related Art

With advances in integrated circuit technology, data storage capacity of semiconductor memory devices has been rapidly increasing, and technologies for manufacturing low-power, high-performance semiconductor memory devices have been making rapid progress. Moreover, recent developments of portable electronic systems such as mobile phones or laptop computers are leading to demands for low-power, high-performance semiconductor memory devices.

The technologies for low-power semiconductor memory devices involve power consumption management of core areas in semiconductor memory devices. The core area including memory cells, bit lines, and word lines may be designed in accordance with a minimum design rule for feature size, and thus scaled-down transistors with lower operation voltages may constitute the memory cells.

Also, a memory cell array including memory cells, bit lines, and word lines, as well as bit line sense amplifiers for sensing/amplifying data of the bit lines are disposed in the core area. In general, in order to reduce power consumption and to increase device reliability in the memory devices such as a dynamic random access memory (DRAM), an internal voltage (core voltage) that is lower than an external voltage is used in the memory cell array and the bit line sense amplifiers. To minimize current consumption in the core area, efficiently placing circuits that generate and supply the core voltage to the bit line sense amplifiers in the surrounding area or core area is desirable.

SUMMARY

Various embodiments of the present invention are directed to a voltage supply circuit of a semiconductor memory device, capable of supplying a driving voltage to a sense amplifying circuit by merging/integrating a driver for a core voltage (VCORE) and a driver for a pull-up voltage (RTO).

In accordance with an embodiment of the present invention, a semiconductor memory device includes: a common driver suitable for generating a preliminary driving signal according to a voltage at a first node; and a plurality of individual drivers suitable for providing a core voltage to a sense amplifying circuit of a corresponding one of a plurality of cell mats, according to the preliminary driving signal, wherein each of the individual drivers includes: a level shifting circuit suitable for outputting a main driving signal by shifting a level of the preliminary driving signal when a corresponding mat select signal and a pull-up driving signal are activated; a pull-up driver suitable for driving a pull-up power line with the core voltage according to the main driving signal; and a switch suitable for coupling the first node to the pull-up power line when the corresponding mat select signal and the pull-up driving signal are activated.

In accordance with an embodiment of the present invention, a semiconductor memory device includes: a common driver suitable for generating a preliminary driving signal according to a voltage at a first node; and a plurality of individual drivers suitable for providing a core voltage to a sense amplifying circuit of a corresponding one of a plurality of cell mats, according to the preliminary driving signal, wherein each of the individual drivers includes: a level shifting circuit suitable for outputting a control signal by shifting a source voltage level when a corresponding mat select signal and a pull-up driving signal are activated, and outputting a main driving signal based on the control signal and the preliminary driving signal; a pull-up driver suitable for driving a pull-up power line with the core voltage according to the main driving signal; and a switch suitable for coupling the first node to the pull-up power line according to the control signal.

In accordance with an embodiment of the present invention, a semiconductor memory device includes: a plurality of cell mats including a plurality of memory cells at intersections of word lines and bit lines; a plurality of sense amplifying circuits suitable for sensing and amplifying data of the bit lines of a corresponding cell mat; a common driver suitable for generating a preliminary driving signal according to a voltage at a first node; a plurality of individual drivers suitable for generating a main driving signal by shifting a level of the preliminary driving signal when a corresponding mat select signal and a pull-up driving signal are activated, and providing a pull-up voltage and a pull-down voltage to a corresponding sense amplifying circuit according to the main driving signal and a pull-down driving signal; and a plurality of switches suitable for coupling the first node to a pull-up power line when the corresponding mat select signal and the pull-up driving signal are activated.

In accordance with an embodiment of the present invention, a semiconductor memory device includes: a plurality of cell mats including a plurality of memory cells at intersections of word lines and bit lines; a plurality of sense amplifying circuits suitable for sensing and amplifying data of the bit lines of a corresponding cell mat; a common driver suitable for generating a preliminary driving signal according to a voltage at a first node; a plurality of individual drivers suitable for generating a control signal by shifting a source voltage level when a corresponding mat select signal and a pull-up driving signal are activated, generating a main driving signal based on the control signal and the preliminary driving signal, and providing a pull-up voltage and a pull-down voltage to a corresponding sense amplifying circuit according to the main driving signal and a pull-down driving signal; and a plurality of switches suitable for coupling the first node to a pull-up power line according to the control signal.

In accordance with an embodiment of the present invention, a semiconductor memory device includes: a common driver suitable for generating a preliminary driving signal according to a voltage at a node; and a plurality of individual drivers suitable for providing a core voltage to a sense amplifying circuit of a corresponding one of a plurality of cell mats, according to the preliminary driving signal, wherein each of the individual drivers includes: a level shifting circuit suitable for outputting a main driving signal by shifting a level of the preliminary driving signal when a corresponding mat select signal and a pull-up driving signal are activated; a pull-up driver suitable for driving a pull-up power line with the core voltage according to the main driving signal; and a switch suitable for coupling the node to the pull-up power line when the corresponding mat select signal and the pull-up driving signal are activated, and wherein the common driver deactivates the preliminary driving signal when the core voltage reaches a target level, to maintain the pull-up power line at a core voltage level.

These and other features and advantages of the present invention will be better understood by those with ordinary skill in the field of the invention from the following detailed description of various embodiments of the invention in conjunction with the accompanying drawings.

DETAILED DESCRIPTION

Figure 1:
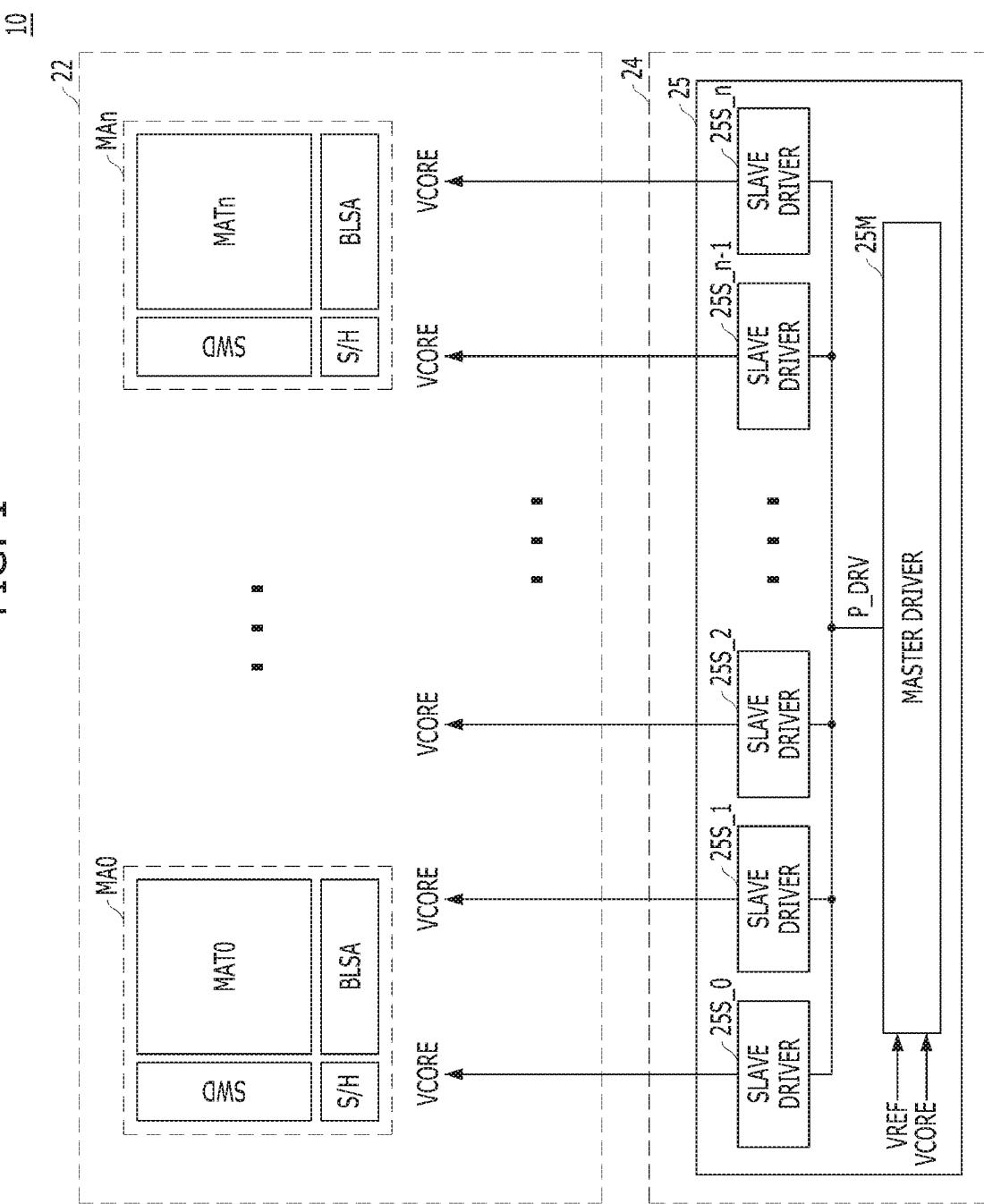
FIG. 1 is a diagram illustrating a configuration of a semiconductor memory device for a bit line sensing operation using an over-driving method.

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure is thorough and complete, and fully conveys the scope of the present invention to those skilled in the art. Throughout the disclosure, like reference numerals refer to like parts throughout the various figures and embodiments of the present invention. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without indicating any change in the element itself.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, various embodiments of the present invention are described in detail with reference to the attached drawings.

Generally, an internal voltage (i.e., a core voltage) lower than an external voltage (i.e., a power supply voltage) is used in a memory cell area and a bit line sense amplifier in order to reduce power consumption and thus improve reliability of a DRAM device. However, there is a limitation in that it takes much time to sense a very small amount of electric charge flowing from a memory cell and convert the sensed electric charge into a complementary metal oxide semiconductor (CMOS) level.

In order to address this limitation, an over-driving method has been proposed. According to the over-driving method, a bit line sense amplifier operates with an external source voltage (VDD) level in an initial operation of a bit line sensing operation, and then operates with a core voltage (VCORE) level.

FIG. 1 is a diagram illustrating a configuration of a semiconductor memory device 10 for a bit line sensing operation using an over-driving method.

Referring to FIG. 1, the semiconductor memory device 10 includes a core area 22 and a peripheral area 24.

The core area 22 may be defined as a bank area. In the core area 22, a plurality of cell mat areas MA0 to MAn composing a bank may be disposed. In each of the plurality of cell mat areas MA0 to MAn, a memory cell array (i.e., a cell mat) MAT # (wherein # is an integer from 0 to n), a word line driving circuit SWD, a sense amplifying circuit BLSA, and a sub-hole area S/H are disposed. The cell mat MAT # may include a plurality of memory cells (MC of FIG. 2) located at intersections of a plurality of word lines (WL of FIG. 2) and a plurality of bit lines (BL of FIG. 2) arranged to form an array. The word line driving circuit SWD may drive the plurality of word lines WL. The sense amplifying circuit BLSA may sense and amplify data of the plurality of bit lines BL. The sub-hole area S/H may be an intersection area between the word line driving circuit SWD and the sense amplifying circuit BLSA.

In the bit line sensing operation using the over-driving method, a core voltage supply circuit 25 for generating and supplying a core voltage VCORE is disposed in the peripheral area 24. In more detail, the core voltage supply circuit 25 may include a master driver 25M, and a plurality of slave drivers 25S_0 to 25S_n. The master driver 25M may generate a preliminary driving signal P_DRV by comparing the core voltage VCORE with a reference voltage VREF. The slave drivers 25S_0 to 25S_n may deliver the core voltage VCORE to the cell mat areas MA0 to MAn through a power mesh within the bank. By way of example, an arrangement in which the slave drivers 25S_0 to 25S_n respectively correspond to the cell mat areas MA0 to MAn is described. However, the present invention is not limited to this arrangement; in another embodiment, more than one of the slave drivers may correspond to one cell mat area.

Figure 2:
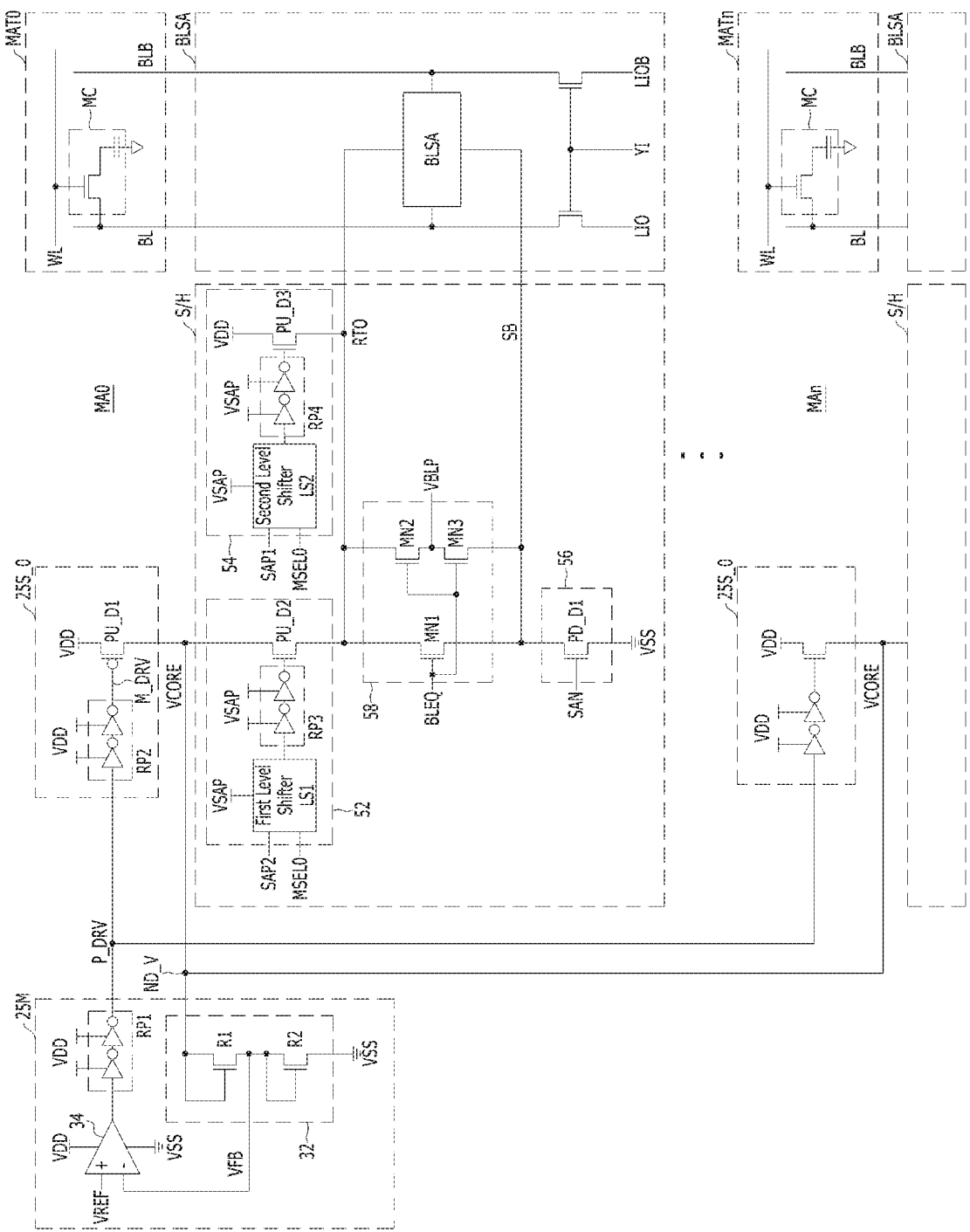
FIG. 2 is a detailed circuit diagram illustrating the semiconductor memory device shown in FIG. 1.

FIG. 2 is a detailed circuit diagram illustrating the semiconductor memory device 10 shown in FIG. 1. In FIG. 2, the master driver 25M and the slave drivers 25S_0 to 25S_n may be disposed in the peripheral area 24.

Referring to FIG. 2, the master driver 25M may include a feedback circuit 32, a comparator 34, and a first repeater RP1. The feedback circuit 32 may output a feedback voltage VFB, which is a percentage or fraction of the core voltage VCORE, at a core voltage node ND_V. The feedback circuit 32 may be configured such that VFB/VCORE conforms to a certain ratio. The comparator 34 may compare the feedback voltage VFB with the reference voltage VREF. The first repeater RP1 may output the preliminary driving signal P_DRV by repeating (i.e., buffering) an output of the comparator 34.

The feedback circuit 32 may include first and second active resistors R1 and R2 coupled in series between the core voltage node ND_V and a ground voltage (VSS) terminal. Each of the first and second active resistors R1 and R2 may be composed of a diode-connected transistor whose gate and drain are coupled, and have first and second resistances, respectively. The level of feedback voltage VFB may be determined by a ratio of the first and second resistances. The comparator 34 may be implemented with an operational amplifier (OP-AMP). The operational amplifier may include a low drop-out (LDO) regulator. The comparator 34 may receive a source voltage VDD and a ground voltage VSS as an operational/driving voltage. The comparator 34 may output a signal swinging between a source voltage (VDD) level and a ground voltage (VSS) level by comparing the feedback voltage VFB with the reference voltage VREF. The first repeater RP1 may receive the source voltage VDD and the ground voltage VSS as an operational/driving voltage. The first repeater RP1 may output the preliminary driving signal P_DRV swinging between the source voltage (VDD) level and the ground voltage (VSS) level by buffering the signal outputted from the comparator 34. Preferably, the first repeater RP1 may include an even number of inverters.

The slave drivers 25S_0 to 25S_n may correspond to the cell mats MAT0 to MATn, respectively. For example, the first slave driver 25S_0 may include a second repeater RP2 and a first pull-up driver PU_D1. The second repeater RP2 may receive the source voltage VDD and the ground voltage VSS as an operational/driving voltage. The second repeater RP2 may output a main driving signal M_DRV swinging between the source voltage (VDD) level and the ground voltage (VSS) level by buffering the preliminary driving signal P_DRV. Preferably, the second repeater RP2 may include an even number of inverters. The first pull-up driver PU_D1 may correspond to the first cell mat MAT0, and be coupled between a source voltage (VDD) terminal and the core voltage node ND_V to receive the main driving signal M_DRV through its gate. Preferably, the first pull-up driver PU_D1 may be implemented with a PMOS transistor.

In the sub-hole area S/H of each of the cell mat areas MA0 to MAn, a pull-up control circuit 52 and 54, and a pull-down control circuit 56 may be disposed. The pull-up control circuit 52 and 54 may provide the core voltage VCORE or the source voltage VDD to a pull-up power line RTO of the sense amplifying circuit BLSA. The pull-down control circuit 56 may provide the ground voltage VSS to a pull-down power line SB of the sense amplifying circuit BLSA.

The pull-up control circuit 52 and 54 may include a normal driving circuit 52 and an over-driving circuit 54. The over-driving circuit 54 may provide the source voltage VDD to the pull-up power line RTO, according to a corresponding mat select signal MSEL # (# being an integer from 0 to n) and a first pull-up driving signal SAP1. The normal driving circuit 52 may provide the core voltage VCORE to the pull-up power line RTO, according to the corresponding mat select signal MSEL # and a second pull-up driving signal SAP2. The corresponding mat select signal MSEL # is activated when a corresponding cell mat is selected and generated by decoding a row address. For example, when a row address for selecting the first cell mat MAT0 is inputted, the first mat select signal MSEL0 is activated. The first pull-up driving signal SAP1 may be activated during an initial section of a bit line sensing operation. The second pull-up driving signal SAP2 may be activated when the first pull-up driving signal SAP1 is deactivated, and deactivated when the bit line sensing operation is completed.

For example, the normal driving circuit 52 may include a first level shifter LS1, a third repeater RP3, and a second pull-up driver PU_D2. The first level shifter LS1 may shift a level of the second pull-up driving signal SAP2 to a pull-up driving voltage (VSAP) level when the first mat select signal MSEL0 is activated. That is, the first level shifter LS1 may convert the second pull-up driving signal SAP2 swinging between the source voltage (VDD) level and the ground voltage (VSS) level, into an output signal swinging between the pull-up driving voltage (VSAP) level and the ground voltage (VSS) level. Preferably, the level of pull-up driving voltage VSAP may be greater than the source voltage (VDD) level, to fully turn on a gate of the second pull-up driver PU_D2. The third repeater RP3 may buffer the output signal of the first level shifter LS1. The third repeater RP3 may receive the pull-up driving voltage VSAP and the ground voltage VSS as an operational/driving voltage. The third repeater RP3 may output an output signal swinging between the pull-up driving voltage (VSAP) level and the ground voltage (VSS) level by buffering the output signal of the first level shifter LS1. Preferably, the third repeater RP3 may include an even number of inverters. The second pull-up driver PU_D2 may be coupled between the core voltage node ND_V and the pull-up power line RTO to drive the pull-up power line RTO with the core voltage VCORE of the core voltage node ND_V according to the output signal of the third repeater RP3.

For example, the over-driving circuit 54 may include a second level shifter LS2, a fourth repeater RP4, and a third pull-up driver PU_D3. The second level shifter LS2 may shift a level of the first pull-up driving signal SAP1 to the pull-up driving voltage (VSAP) level when the first mat select signal MSEL0 is activated. That is, the second level shifter LS2 may convert the first pull-up driving signal SAP1 swinging between the source voltage (VDD) level and the ground voltage (VSS) level, into an output signal swinging between the pull-up driving voltage (VSAP) level and the ground voltage (VSS) level. The fourth repeater RP4 may buffer the output signal of the second level shifter LS2. The fourth repeater RP4 may receive the pull-up driving voltage VSAP and the ground voltage VSS as an operational/driving voltage. The fourth repeater RP4 may output an output signal swinging between the pull-up driving voltage (VSAP) level and the ground voltage (VSS) level by buffering the output signal of the second level shifter LS2. Preferably, the fourth repeater RP4 may include an even number of inverters. The third pull-up driver PU_D3 may be coupled between the source voltage (VDD) terminal and the pull-up power line RTO, to drive the pull-up power line RTO with the source voltage VDD according to the output signal of the fourth repeater RP4. Preferably, the second pull-up driver PU_D2 and the third pull-up driver PU_D3 may be implemented with an NMOS transistor.

The pull-down control circuit 56 may provide the ground voltage VSS to the pull-down power line SB according to a pull-down driving signal SAN. The pull-down driving signal SAN may be activated during the bit line sensing operation. The pull-down control circuit 56 may include a pull-down driver PD_D1 which is coupled between the pull-down power line SB and the ground voltage (VSS) terminal to drive the pull-down power line SB with the ground voltage VSS according to the pull-down driving signal SAN. Preferably, the pull-down driver PD_D1 may be implemented with an NMOS transistor.

In the sub-hole area S/H of each of the cell mat areas MA0 to MAn, a precharge circuit 58 may be disposed. The precharge circuit 58 may precharge the pull-up power line RTO and the pull-down power line SB during a precharge operation. The precharge circuit 58 may precharge the pull-up power line RTO and the pull-down power line SB with a precharge voltage VBLP according to a bit line equalization signal BLEQ. Thus, in an embodiment, a bit line BL and a bit line bar BLB are equalized to share charge. The bit line equalization signal BLEQ is activated during the precharge operation, and deactivated to a logic low level during the bit line sensing operation. The level of precharge voltage VBLP may be half that of the core voltage VCORE. The sense amplifying circuit BLSA may sense and amplify a voltage difference between the bit line BL and the bit line bar BLB, during the bit line sensing operation after the charge sharing therebetween.

In detail, the precharge circuit 58 may include first to third transistors MN1 to MN3. The first transistor MN1 may be coupled between the pull-up power line RTO and the pull-down power line SB, and turned on in response to the bit line equalization signal BLEQ. The second transistor MN2 and the third transistor MN3 may be coupled in series between the pull-up power line RTO and the pull-down power line SB, and turned on in response to the bit line equalization signal BLEQ. The precharge voltage VBLP may be applied to a common source of the second transistor MN2 and the third transistor MN3.

The cell mats MAT0 to MATn may include the plurality of memory cells MC located at intersections of the plurality of word lines WL and the plurality of bit lines BL/BLB. The sense amplifying circuit BLSA may sense and amplify a voltage difference between the bit line BL and the bit line bar BLB. During a read operation, data of the bit line BL and the bit line bar BLB may be transferred to input/output lines LIO and LIOB according to a column select signal YI. During a write operation, data of the input/output lines LIO and LIOB may be transferred to the bit line BL and the bit line bar according to a column select signal YI.

Hereinafter, referring to FIGS. 1 to 3, an operation of the semiconductor memory device 10 is explained.

Figure 3:
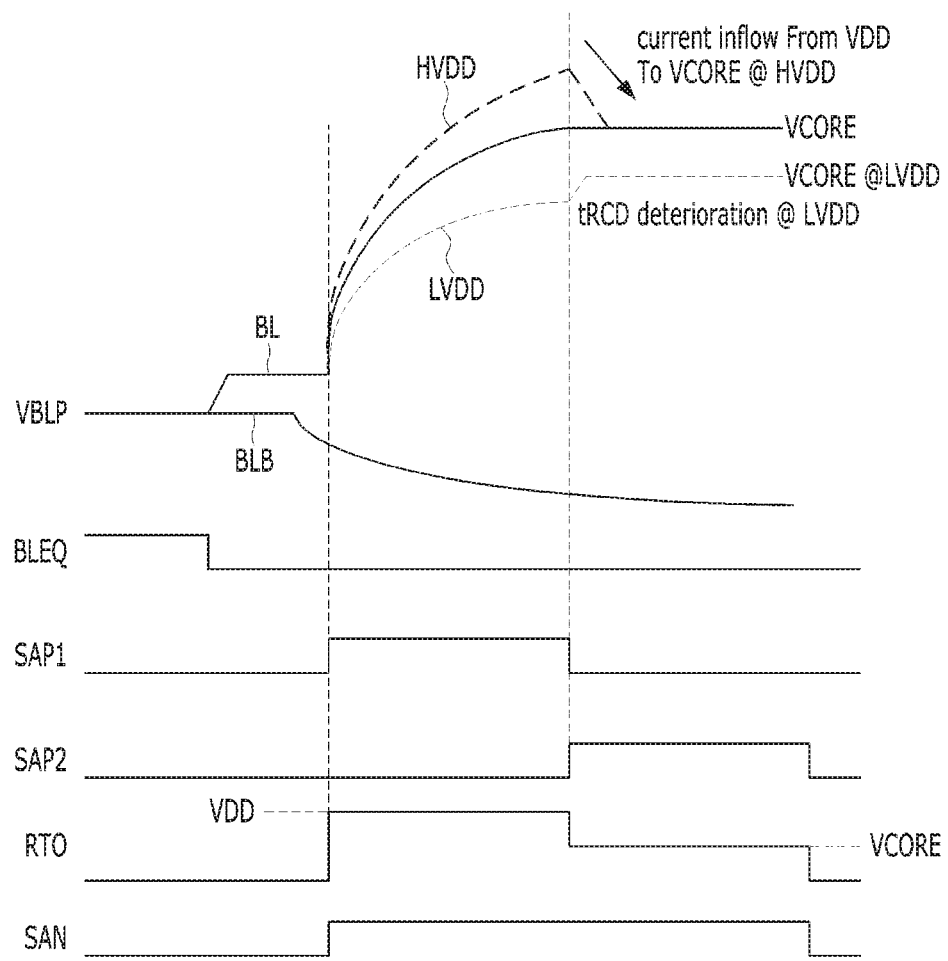
FIG. 3 is a waveform diagram illustrating the bit line sensing operation of the semiconductor memory device shown in FIG. 1.

FIG. 3 is a waveform diagram illustrating the bit line sensing operation of the semiconductor memory device 10 shown in FIG. 1.

Referring to FIG. 3, before the bit line sensing operation, the bit line equalization signal BLEQ is activated to a logic high level. According to the bit line equalization signal BLEQ, the first to third transistors MN1 to MN3 of the precharge circuit 58 are turned on, so that the bit line BL and the bit line bar BLB are precharged to the precharge voltage VBLP.

During the initial section of the bit line sensing operation, the first pull-up driving signal SAP1 and the pull-down driving signal SAN are activated. The over-driving circuit 54 provides the source voltage VDD to the pull-up power line RTO, according to the corresponding mat select signal MSEL # and the first pull-up driving signal SAP1. The pull-down control circuit 56 provides the ground voltage VSS to the pull-down power line SB according to the pull-down driving signal SAN. Accordingly, the sense amplifying circuit BLSA may perform an over-driving operation by sensing and amplifying a voltage difference between the bit line BL and the bit line bar BLB between the source voltage (VDD) level and the ground voltage (VSS) level.

Thereafter, the first pull-up driving signal SAP1 is deactivated, and thus the second pull-up driving signal SAP2 is activated. The normal driving circuit 52 provides the core voltage VCORE to the pull-up power line RTO, according to the corresponding mat select signal MSEL # and the second pull-up driving signal SAP2. The pull-down control circuit 56 provides the ground voltage VSS to the pull-down power line SB according to the pull-down driving signal SAN. Accordingly, the sense amplifying circuit BLSA may perform a normal driving operation by sensing and amplifying a voltage difference between the bit line BL and the bit line bar BLB between the core voltage (VCORE) level and the ground voltage (VSS) level.

The master driver 25M generates the preliminary driving signal P_DRV to be deactivated when the core voltage VCORE of the core voltage node ND_V reaches a target level, to maintain the pull-up power line RTO to the core voltage (VCORE) level.

As described above, by performing the over-driving operation, the characteristics of a parameter tRCD (Row address to Column address Delay), which indicates a delay time from an input of the row address to an input of the column address, can be improved. In a higher voltage environment (HVDD), due to a high voltage level developed during the over-driving operation (i.e., due to the large amount of charges), the amount of current flowing into a core voltage (VCORE) terminal, i.e., the core voltage node ND_V, may suddenly increase when converting from the over-driving operation to the normal driving operation. On the other hand, in a lower voltage environment (LVDD), due to a lower slope of a voltage developed during the over-driving operation, it takes a long time for the voltage on the pull-up power line RTO to become the core voltage (VCORE) level, which may deteriorate the tRCD characteristics. In addition, the over-driving circuit 54 disposed in the core area 22 of the semiconductor memory device 10 should be supplied with the external source voltage VDD and the core voltage VCORE from the peripheral area 24, so the power mesh for the core voltage VCORE may be provided within the bank. As a result, the drive circuit for over-driving operation in the semiconductor memory device 10 requires a large amount of area and complex wiring, which may reduce net-die efficiency and yield.

Hereinafter, a method to place the core voltage supply circuit in the core area is explained. In accordance with an embodiment of the present invention, a method is proposed for utilizing the core area more efficiently while improving performance without introducing an over-driving method.

Figure 4:
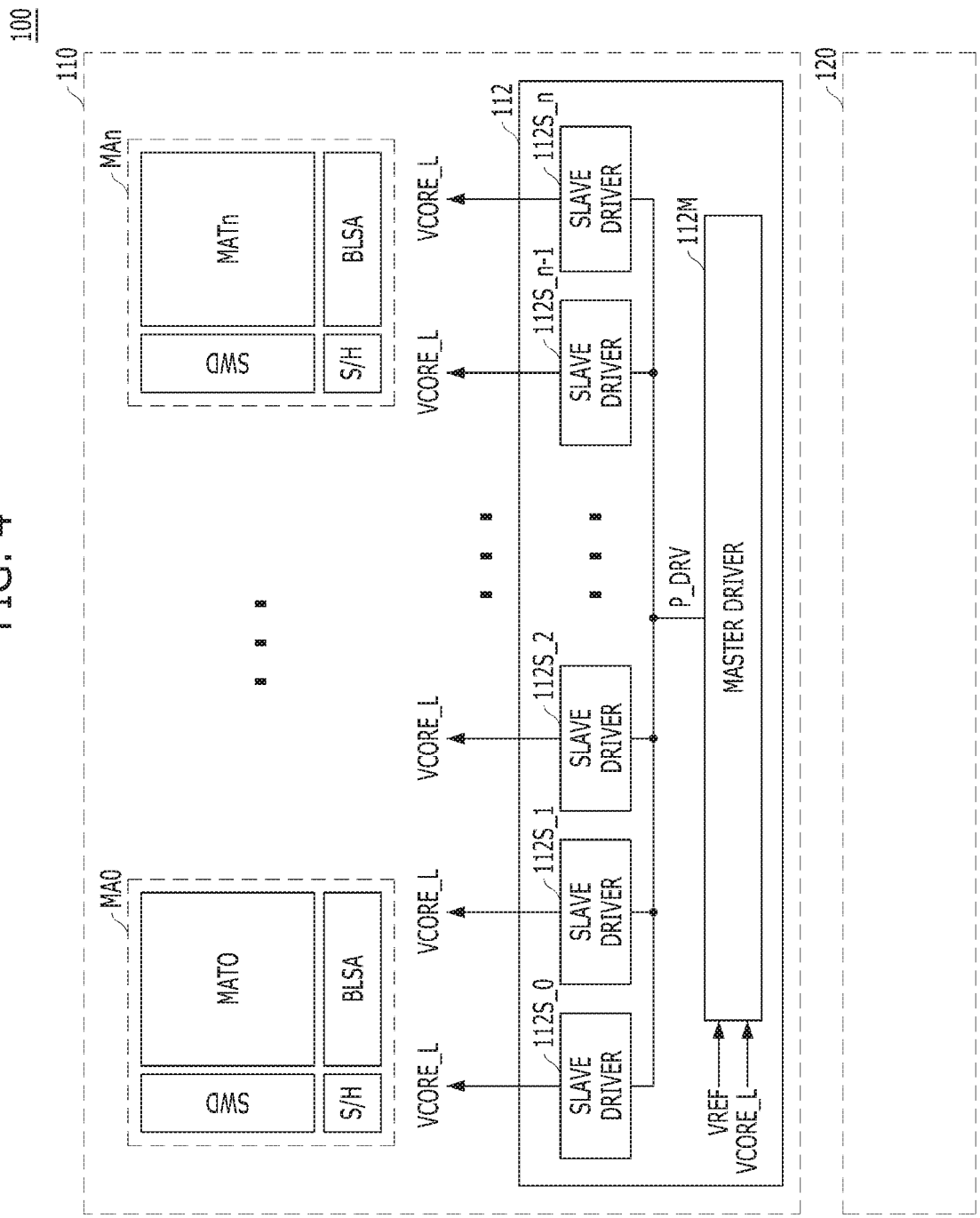
FIG. 4 is a diagram illustrating a configuration of a semiconductor memory device in accordance with a first embodiment of the present invention.

FIG. 4 is a diagram illustrating a configuration of a semiconductor memory device 100 in accordance with a first embodiment of the present invention.

Referring to FIG. 4, the semiconductor memory device 100 includes a core area 110 and a peripheral area 120.

In the core area 110, a plurality of cell mat areas MA0 to MAn and a core voltage supply circuit 112 may be disposed. Since the cell mat areas MA0 to MAn have substantially the same configuration as those of FIG. 1, detailed description thereof is omitted here.

The core voltage supply circuit 112 may include a master driver 112M, and a plurality of slave drivers 112S_0 to 112S_n. The master driver 112M may generate a preliminary driving signal P_DRV by comparing a core voltage VCORE_L with a reference voltage VREF. The slave drivers 112S_0 to 112S_n may deliver the core voltage VCORE_L to the cell mat areas MA0 to MAn through a power mesh within a bank.

For reference, the semiconductor memory device 10 of FIG. 1 receives not only the source voltage VDD but also the core voltage VCORE from the peripheral area 24. On the contrary, the semiconductor memory device 100 of FIG. 4 receives only the source voltage VDD from the peripheral area 120. Accordingly, by removing unnecessary wirings/interconnections, the net-die efficiency and yield can be improved.

Figure 5:
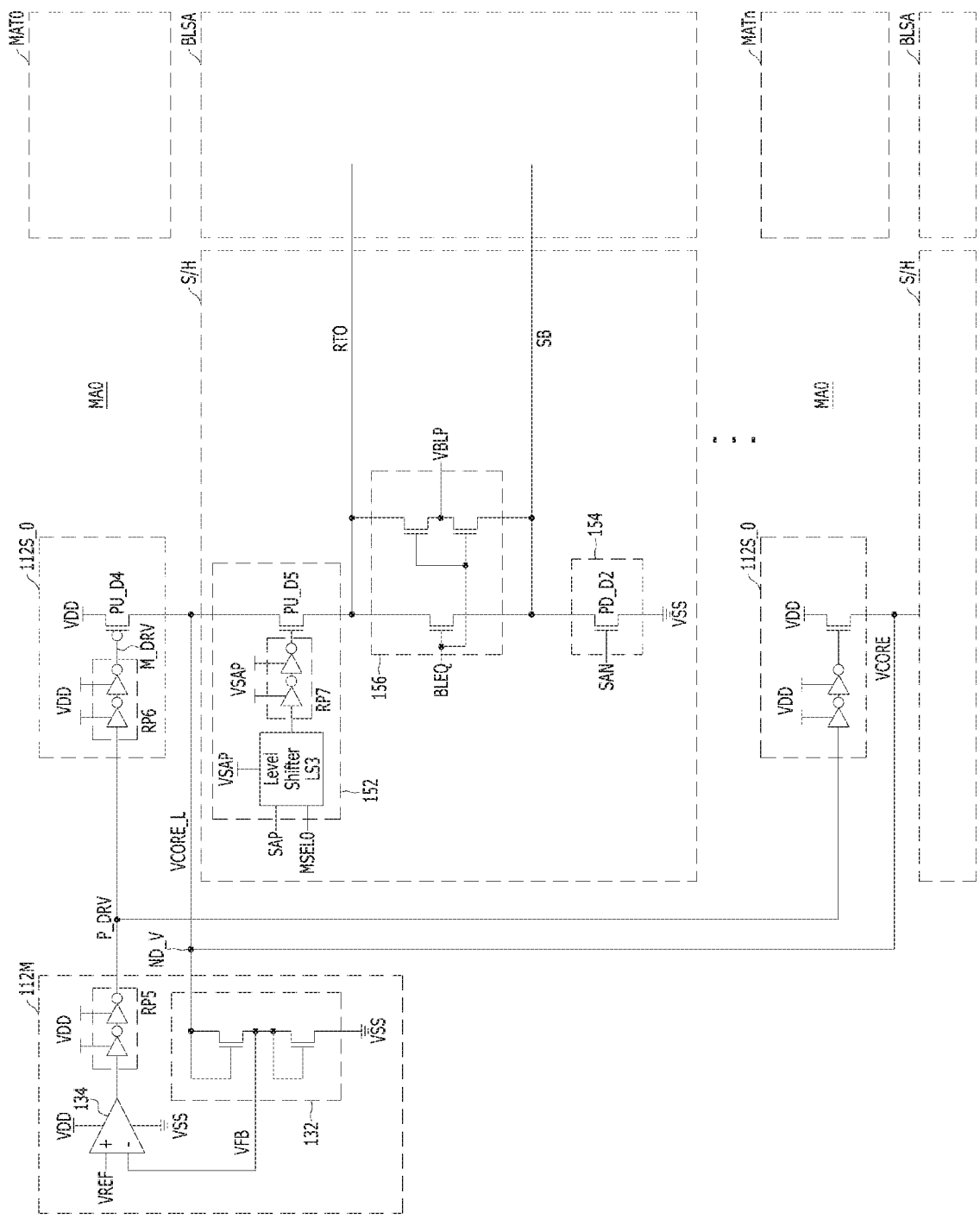
FIG. 5 is a detailed circuit diagram illustrating a semiconductor memory device, such as that shown in FIG. 4.

FIG. 5 is a detailed circuit diagram illustrating the semiconductor memory device 100 shown in FIG. 4.

Referring to FIG. 5, the master driver 120M may include a feedback circuit 132, a comparator 134, and a first repeater RP5. The feedback circuit 132 may output a feedback voltage VFB, which is a percentage of the core voltage VCORE_L, at a core voltage node ND_V. The feedback circuit 132 may be configured such that VFB/VCORE conforms to a certain ratio. The comparator 134 may compare the feedback voltage VFB with the reference voltage VREF. The first repeater RP5 may output the preliminary driving signal P_DRV by repeating (i.e., buffering) an output of the comparator 134. The slave drivers 112S_0 to 112S_n may correspond to the cell mat areas MA0 to MAn, respectively. For example, the first slave driver 112S_0 may include a second repeater RP6 and a first pull-up driver PU_D4. The second repeater RP6 may output a main driving signal M_DRV by buffering the preliminary driving signal P_DRV. The first pull-up driver PU_D4 may be coupled between a source voltage (VDD) terminal and the core voltage node ND_V to receive the main driving signal M_DRV through its gate. Except that the master driver 112M and the slave drivers 112S_0 to 112S_n are disposed in the core area 110, the master driver 112M and the slave drivers 112S_0 to 112S_n have substantially the same configuration as those of FIG. 2. Thus, detailed description of the configuration is omitted here.

In a sub-hole area S/H of each of the cell mat areas MA0 to MAn, a pull-up control circuit 152, and a pull-down control circuit 154 may be disposed. The pull-up control circuit 152 may provide the core voltage VCORE_L to a pull-up power line RTO of a sense amplifying circuit BLSA. The pull-down control circuit 154 may provide the ground voltage VSS to a pull-down power line SB of the sense amplifying circuit BLSA.

The pull-up control circuit 152 may provide the core voltage VCORE_L to the pull-up power line RTO, according to a corresponding mat select signal MSEL # and a pull-up driving signal SAP. The pull-up driving signal SAP may be activated during a bit line sensing operation. The pull-up control circuit 152 may correspond to the normal driving circuit 52 of the pull-up control circuit of FIG. 2, without the over-driving circuit 54. The pull-up control circuit 152 may include a level shifter LS3, a third repeater RP7, and a second pull-up driver PU_D5. The level shifter LS3 may shift a level of the pull-up driving signal SAP to a pull-up driving voltage (VSAP) level when the first mat select signal MSEL0 is activated. That is, the level shifter LS3 may convert the pull-up driving signal SAP swinging between a source voltage (VDD) level and a ground voltage (VSS) level, into an output signal swinging between a pull-up driving voltage (VSAP) level and the ground voltage (VSS) level. The third repeater RP7 may buffer the output signal of the level shifter LS3 to output an output signal swinging between the pull-up driving voltage (VSAP) level and the ground voltage (VSS) level by buffering the output signal of the level shifter LS3. Preferably, the third repeater RP7 may include an even number of inverters. The second pull-up driver PU_D5 may be coupled between the core voltage node ND_V and the pull-up power line RTO to drive the pull-up power line RTO with the core voltage VCORE_L of the core voltage node ND_V according to the output signal of the third repeater RP7. Preferably, the second pull-up driver PU_D5 may be implemented with an NMOS transistor.

The pull-down control circuit 154 may provide the ground voltage VSS to the pull-down power line SB according to a pull-down driving signal SAN. The pull-down driving signal SAN may be activated during the bit line sensing operation. The pull-down control circuit 154 may include a pull-down driver PD_D2 which is coupled between the pull-down power line SB and a ground voltage (VSS) terminal to drive the pull-down power line SB with the ground voltage VSS according to the pull-down driving signal SAN. Preferably, the pull-down driver PD_D2 may be implemented with an NMOS transistor.

In the sub-hole area S/H of each of the cell mat areas MA0 to MAn, a precharge circuit 156 may be disposed. The precharge circuit 156 may precharge the pull-up power line RTO and the pull-down power line SB during a precharge operation. Since the precharge circuit 156 may have substantially the same configuration as that of FIG. 2, detailed description thereof is omitted here. The cell mats MAT0 to MATn may include a plurality of memory cells MC located at intersections of a plurality of word lines WL and a plurality of bit lines BL/BLB. The sense amplifying circuit BLSA may sense and amplify a voltage difference between the bit line BL and the bit line bar BLB. Since the cell mats MAT0 to MATn and the sense amplifying circuit BLSA may have substantially the same configuration as those of FIG. 2, detailed description thereof is omitted here.

Hereinafter, referring to FIGS. 4 to 6, an operation of the semiconductor memory device 100 is explained.

Figure 6:
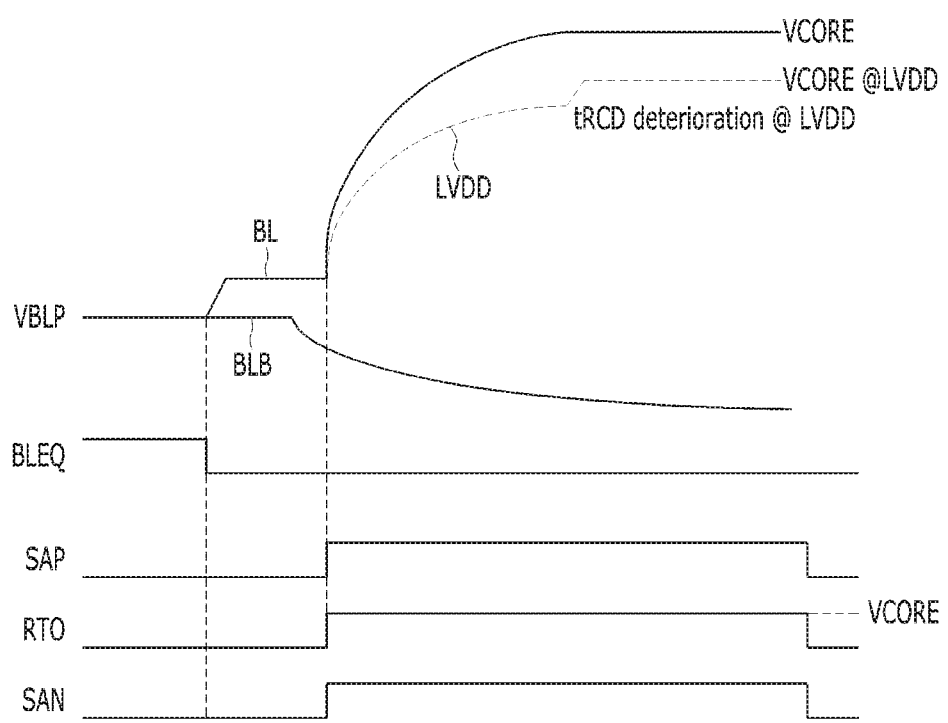
FIG. 6 is a waveform diagram illustrating a bit line sensing operation of a semiconductor memory device, such as that shown in FIG. 4.

FIG. 6 is a waveform diagram illustrating a bit line sensing operation of the semiconductor memory device 100 shown in FIG. 4.

Referring to FIG. 6, before the bit line sensing operation, according to a bit line equalization signal BLEQ activated to a logic high level, the precharge circuit 156 is turned on, so that the bit line BL and the bit line bar BLB are precharged to a precharge voltage VBLP.

During the bit line sensing operation, the pull-up driving signal SAP and the pull-down driving signal SAN are activated. The pull-up control circuit 152 provides the core voltage VCORE_L to the pull-up power line RTO, according to the corresponding mat select signal MSEL # and the pull-up driving signal SAP. The pull-down control circuit 154 provides the ground voltage VSS to the pull-down power line SB according to the pull-down driving signal SAN. Accordingly, the sense amplifying circuit BLSA may perform a normal driving operation by sensing and amplifying a voltage difference between the bit line BL and the bit line bar BLB between the core voltage (VCORE_L) level and the ground voltage (VSS) level. The master driver 112M generates the preliminary driving signal P_DRV to be deactivated when the core voltage VCORE_L of the core voltage node ND_V reaches a target level, to maintain the pull-up power line RTO to the core voltage (VCORE_L) level.

As described above, by disposing the core voltage supply circuit 112 in the core area 110, not in the peripheral area 120, the sense amplifying circuit BLSA may perform the bit line sensing operation using the local/internal core voltage VCORE_L provided from the more adjacently disposed core voltage supply circuit 112. Therefore, even without an over-driving operation, a stable operation is possible and performance can be improved at the same time. In addition, since the configurations of the core area 110 receive only the external source voltage VDD from the peripheral area 120, unnecessary wirings/interconnections can be removed to improve net-die efficiency and yield.

In a higher voltage environment (HVDD), since the over-driving operation is omitted, the concern that the amount of current flowing into a core voltage (VCORE) terminal, i.e., the core voltage node ND_V, may suddenly increase (see FIG. 3) can be addressed. On the other hand, in a lower voltage environment (LVDD), since the resistance in view of the core area 110 is formed by the channel resistance of a stack structure of the first pull-up driver PU_D4 and the second pull-up driver PU_D5, a voltage development to the pull-up power line RTO may be degraded. As a result, when the voltage drop occurs during the bit line sensing operation, the channel resistance of the stack structure increases the drop volume and it takes a long time for the voltage of the pull-up power line RTO to reach the core voltage (VCORE_L) level, further aggravating the tRCD characteristics.

Figure 7:
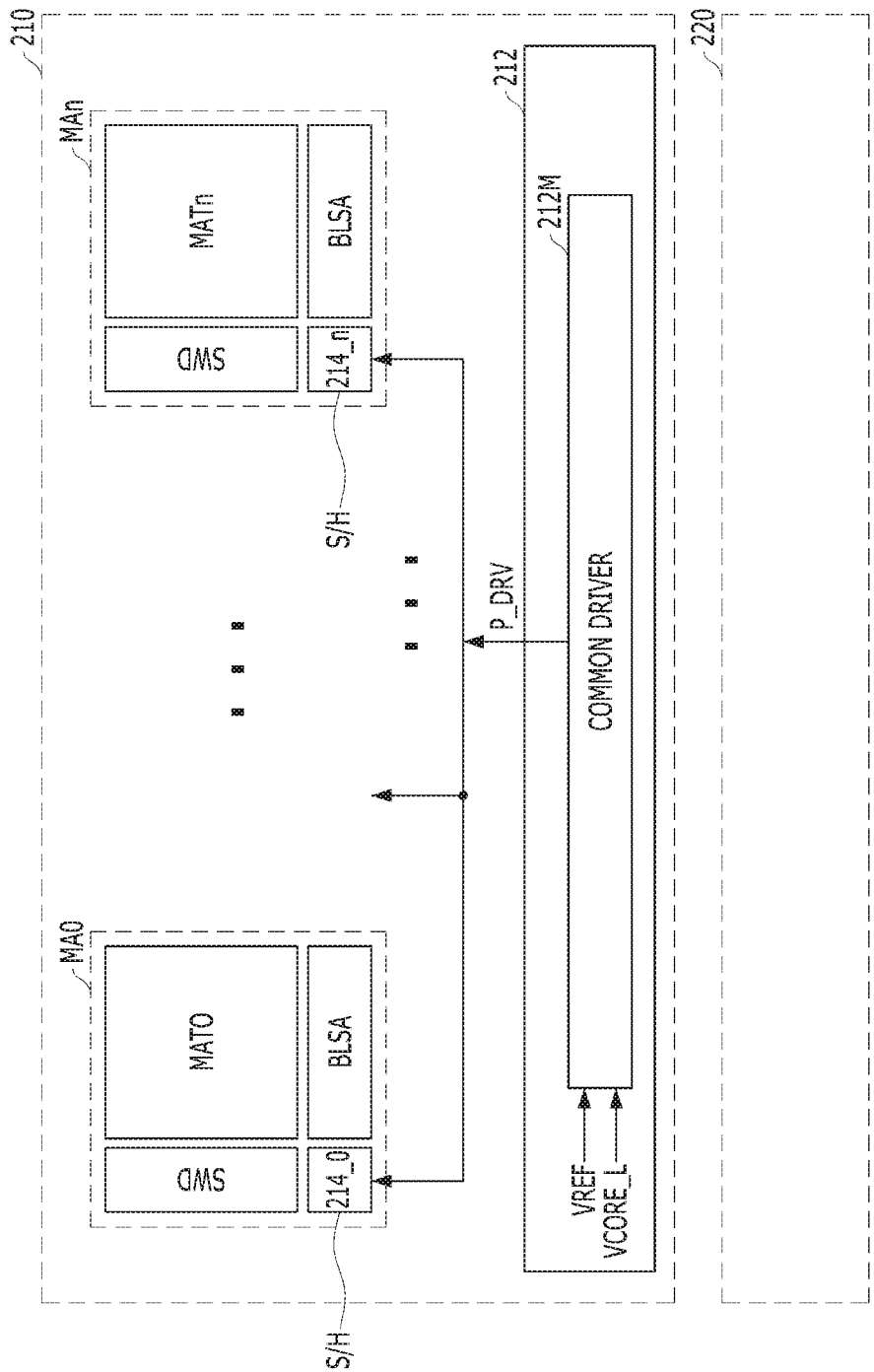
FIG. 7 is a diagram illustrating a configuration of a semiconductor memory device in accordance with a second embodiment of the present invention.

FIG. 7 is a diagram illustrating a configuration of a semiconductor memory device 200 in accordance with a second embodiment of the present invention.

Referring to FIG. 7, the semiconductor memory device 200 includes a core area 210 and a peripheral area 220.

In the core area 210, a plurality of cell mat areas MA0 to MAn and a core voltage supply circuit 212 may be disposed. The core voltage supply circuit 212 may include a master driver 212M. The master driver 212M may generate a preliminary driving signal P_DRV by comparing a core voltage VCORE_L with a reference voltage VREF. Hereinafter, the master driver 212M in accordance with the second embodiment of the present invention may be defined as a common driver 212M.

In a sub-hole area S/H of each of the cell mat areas MA0 to MAn, a plurality of individual drivers 214_0 to 214_n may be disposed. The individual drivers 214_0 to 214_n may correspond to the cell mat areas MA0 to MAn, respectively. In accordance with the second embodiment, the individual drivers 214_0 to 214_n may be configured by merging/integrating the plurality of slave drivers of FIG. 1 or FIG. 4 and the pull-up drivers of the pull-up control circuit in the sub-hole area S/H of FIG. 1 or FIG. 4. The individual drivers 214_0 to 214_n may provide the core voltage VCORE_L to a sense amplifying circuit BLSA of a corresponding one of the cell mats MAT0 to MATn, according to the preliminary driving signal P_DRV.

Figure 8:
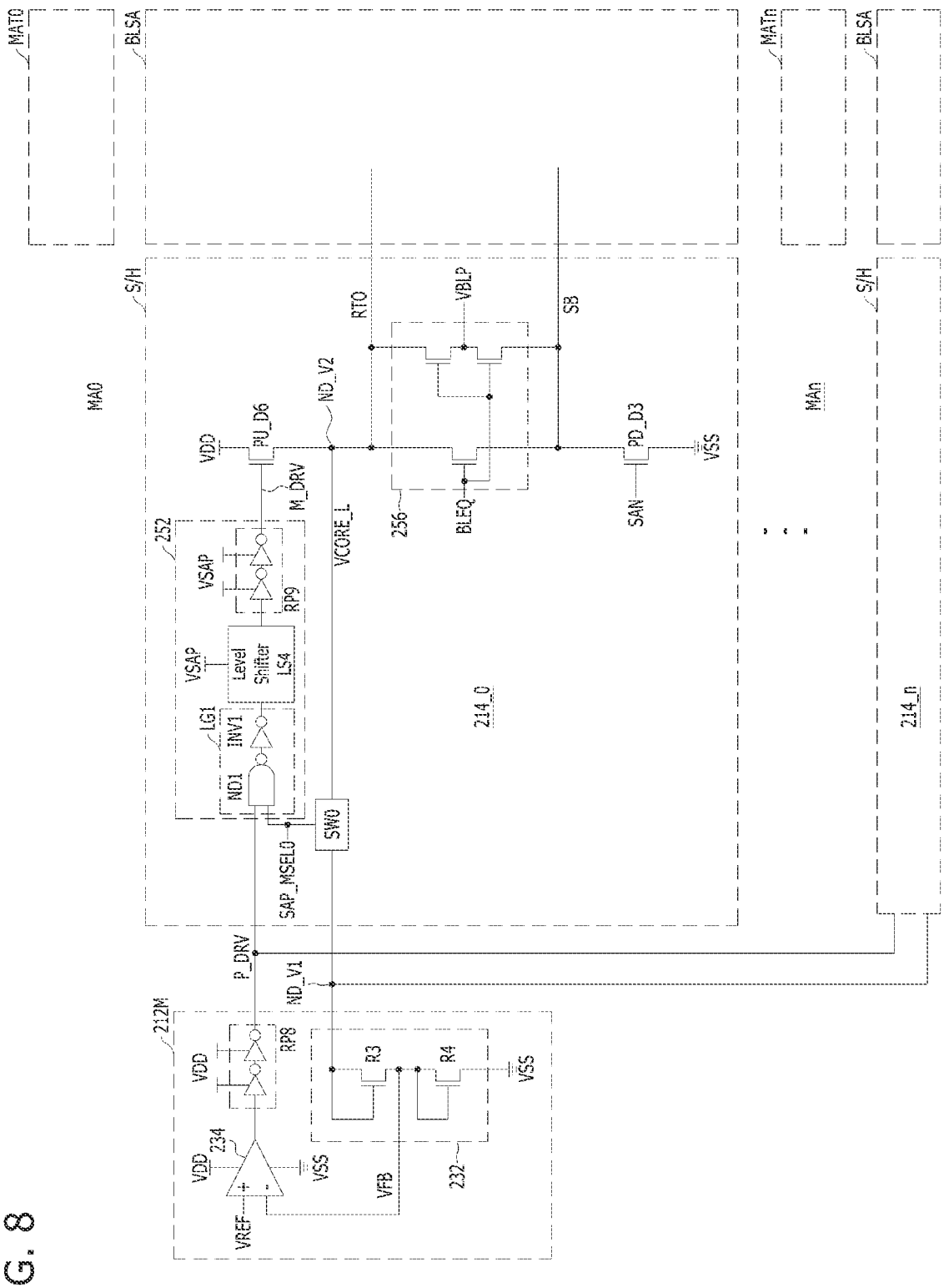
FIG. 8 is a detailed circuit diagram illustrating a semiconductor memory device, such as that shown in FIG. 7.

FIG. 8 is a detailed circuit diagram illustrating the semiconductor memory device 200 shown in FIG. 7.

Referring to FIG. 8, the common driver 212M may generate a preliminary driving signal P_DRV according to a voltage at a first node ND_V1. The common driver 212M may include a feedback circuit 232, a comparator 234, and a first repeater RP8. The feedback circuit 232 may output a feedback voltage VFB by dividing the voltage at the first node ND_V1 by a certain ratio. The comparator 234 may compare the feedback voltage VFB with the reference voltage VREF. The first repeater RP8 may output the preliminary driving signal P_DRV by repeating (i.e., buffering) an output of the comparator 234. The feedback circuit 232 may include first and second active resistors R3 and R4 coupled in series between the first node ND_V1 and a ground voltage (VSS) terminal. Each of the first and second active resistors R3 and R4 may be composed of a diode-connected transistor whose gate and drain are coupled, and have first and second resistances, respectively. The level of feedback voltage VFB may be determined by a ratio of the first and second resistances. Since the common driver 212M may have substantially the same configuration as that of FIG. 5, detailed description thereof is omitted here.

In the sub-hole area S/H of each of the cell mat areas MA0 to MAn, the plurality of individual drivers 214_0 to 214_n may be disposed. The individual drivers 214_0 to 214_n may provide the core voltage VCORE_L to the sense amplifying circuit BLSA of the corresponding cell mat, according to the preliminary driving signal P_DRV. For example, the first individual driver 214_0 may include a level shifting circuit 252, a pull-up driver PU_D6, and a switch SW0. The level shifting circuit 252 may output a main driving signal M_DRV by shifting or converting a level of the preliminary driving signal P_DRV when a first mat select signal MSEL0 and a pull-up driving signal SAP are activated. That is, the level shifting circuit 252 may convert the preliminary driving signal P_DRV swinging between a source voltage (VDD) level and a ground voltage (VSS) level, into the main driving signal M_DRV swinging between a pull-up driving voltage (VSAP) level and the ground voltage (VSS) level. The pull-up driver PU_D6 may be coupled between a source voltage (VDD) terminal and the second node ND_V2 to receive the main driving signal M_DRV through its gate. Preferably, the pull-up driver PU_D6 may be implemented with an NMOS transistor. The switch SW0 may couple the first node ND_V1 to the second node ND_V2 when the first mat select signal MSEL0 and the pull-up driving signal SAP are activated. The second node ND_V2 may be coupled to a pull-up power line RTO. The first individual driver 2140 may further include a pull-down driver PD_D3 for driving a pull-down power line SB with the ground voltage VSS according to a pull-down driving signal SAN.

In FIG. 8, the numeral reference SAP_MSEL # (wherein # is an integer from 0 to n) denotes a signal activated to a logic high level when the corresponding mat select signal MSEL # and the pull-up driving signal SAP are activated. Depending on an embodiment, logic gates for performing a logic AND operation on the corresponding mat select signal MSEL # and the pull-up driving signal SAP may be provided.

In detail, the level shifting circuit 252 may include a logic circuit LG1, a level shifter LS4, and a second repeater RP9. The logic circuit LG1 may perform a logic AND operation on the signal SAP_MSEL0 and the preliminary driving signal P_DRV. The level shifter LS4 may shift a level of an output signal of the logic circuit LG1 to a pull-up driving voltage (VSAP) level. The level shifter LS4 may convert the output signal of the logic circuit LG1 swinging between the source voltage (VDD) level and the ground voltage (VSS) level, into an output signal swinging between the pull-up driving voltage (VSAP) level and the ground voltage (VSS) level. The second repeater RP9 may buffer the output signal of the level shifter LS4 to output the main driving signal M_DRV. The second repeater RP9 may receive the pull-up driving voltage VSAP and the ground voltage VSS as an operational/driving voltage. The second repeater RP9 may output the main driving signal M_DRV swinging between the pull-up driving voltage (VSAP) level and the ground voltage (VSS) level by buffering the output signal of the level shifter LS4. Preferably, the second repeater RP9 may include an even number of inverters.

FIG. 8 shows the logic circuit LG1 which is implemented with a first NAND gate ND1 for performing a NAND operation on the signal SAP_MSEL0 and the preliminary driving signal P_DRV, and a first inverter INV1 for inverting an output of the first NAND gate ND1. However, the present invention is not limited to this configuration; in another embodiment, the logic circuit LG1 may be implemented with any of various types of logic gates for performing an AND operation.

A precharge circuit 256, a plurality of cell mats MAT0 to MATn, and a sense amplifying circuit BLSA may have substantially the same configuration as those of FIG. 1; thus, detailed description thereof is omitted here.

Hereinafter, referring to FIGS. 7 to 9, an operation of the semiconductor memory device 200 is explained.

Figure 9:
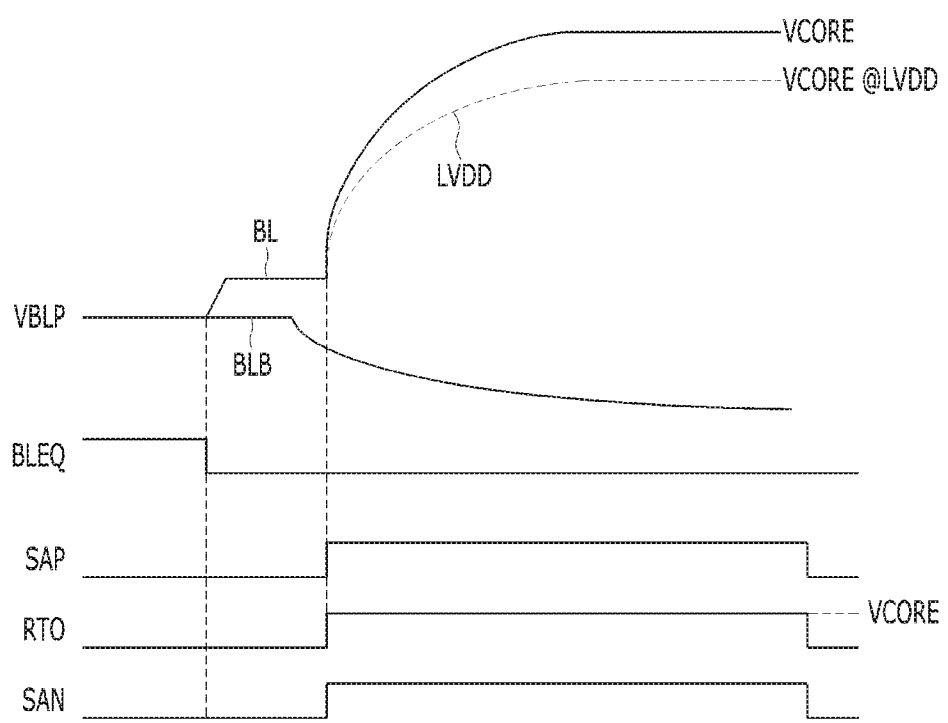
FIG. 9 is a waveform diagram illustrating a bit line sensing operation of a semiconductor memory device, such as that shown in FIG. 7.

FIG. 9 is a waveform diagram illustrating a bit line sensing operation of the semiconductor memory device 200 shown in FIG. 7.

Referring to FIG. 9, before the bit line sensing operation, according to a bit line equalization signal BLEQ activated to a logic high level, the precharge circuit 256 is turned on, so that the bit line BL and the bit line bar BLB are precharged to a precharge voltage VBLP.

During the bit line sensing operation, the pull-up driving signal SAP and the pull-down driving signal SAN are activated. It is assumed that a row address for selecting the first cell mat MAT0 is inputted and thus the first mat select signal MSEL0 is activated. According to the first mat select signal MSEL0, the level shifting circuit 252 of the first individual driver 214_0 outputs the main driving signal M_DRV by shifting or converting the level of the preliminary driving signal P_DRV. The pull-up driver PU_D6 drives the second node ND_V2 with the source voltage VDD according to the main driving signal M_DRV. The pull-down driver PD_D3 drives the pull-down power line SB with the ground voltage VSS according to the pull-down driving signal SAN. Accordingly, the sense amplifying circuit BLSA may perform a normal driving operation by sensing and amplifying a voltage difference between the bit line BL and the bit line bar BLB between the core voltage (VCORE_L) level and the ground voltage (VSS) level. The master driver 112M generates the preliminary driving signal P_DRV to be deactivated when the core voltage VCORE_L of the core voltage node ND_V reaches a target level, to maintain the pull-up power line RTO to the core voltage (VCORE_L) level.

The switch SW0 is turned on to couple the first node ND_V1 to the second node ND_V2. Accordingly, the common driver 212M generates the preliminary driving signal P_DRV by comparing the core voltage VCORE_L fed back from the first individual driver 2140, with a reference voltage VREF. The common driver 212M may deactivate the preliminary driving signal P_DRV when the core voltage VCORE_L of the second node ND_V2 reaches a target level, to maintain the pull-up power line RTO to the core voltage (VCORE_L) level. As a result, the pull-up driver PU_D6 drives the second node ND_V2 (i.e., the pull-up power line RTO) with the core voltage VCORE_L according to the main driving signal M_DRV. Accordingly, the bit line sensing operation of the first cell mat MAT0 may be performed.

In a higher voltage environment (HVDD), since an overdriving operation is omitted, the concern that the amount of current flowing into a core voltage (VCORE) terminal, i.e., the second node ND_V2, may suddenly increase (see FIG. 3) can be addressed. In a lower voltage environment (LVDD), since the resistance in view of the core area 210 is formed by the channel resistance of only the pull-up driver PU_D6, voltage development to the pull-up power line RTO may be performed without being degraded. As a result, without deteriorating the tRCD characteristics, the bit line sensing operation may be performed.

Figure 10:
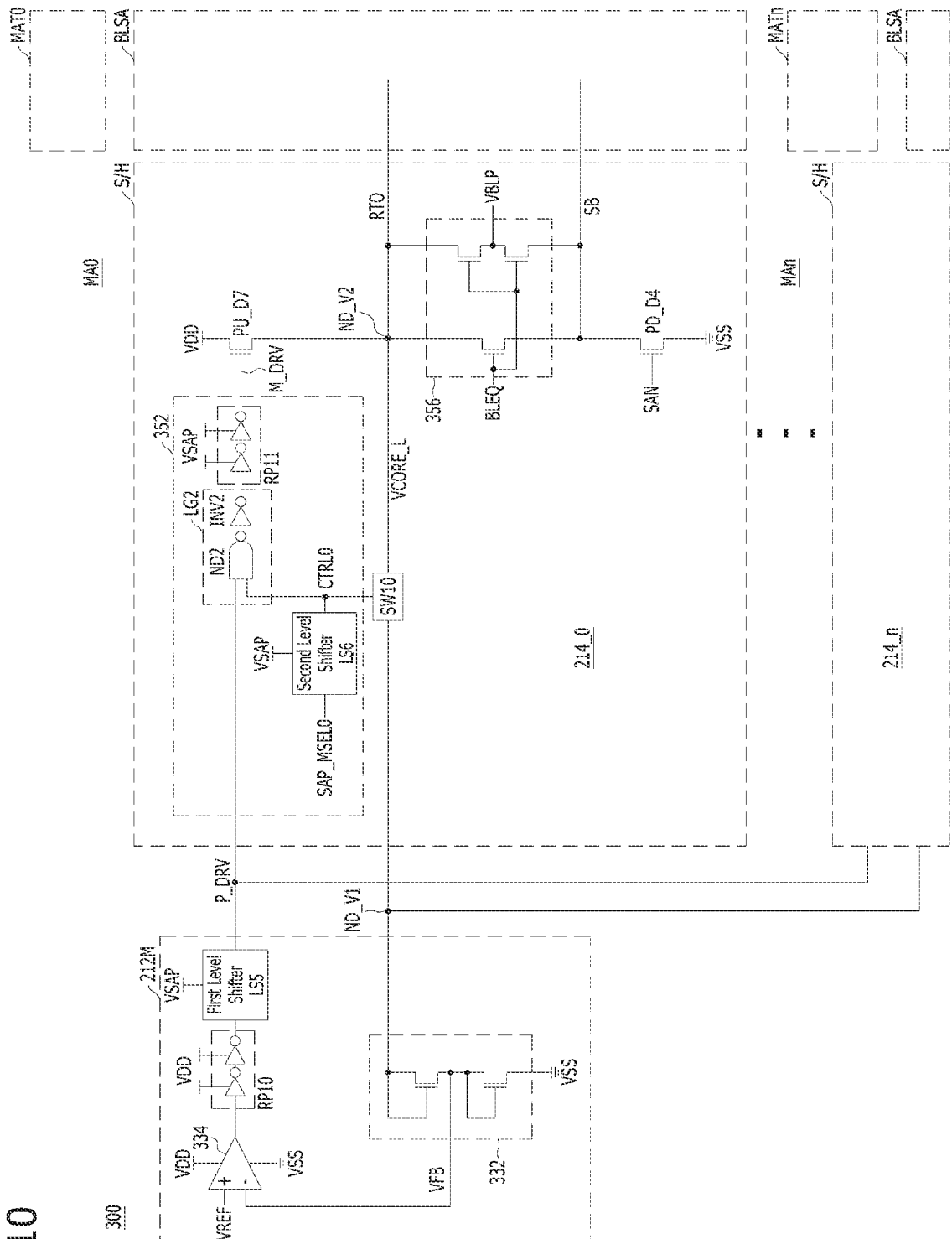
FIG. 10 is a detailed circuit diagram illustrating a semiconductor memory device, such as that shown in FIG. 7, in accordance with another embodiment of the present invention.

FIG. 10 is a detailed circuit diagram illustrating a semiconductor memory device 300 shown in FIG. 7 in accordance with another embodiment of the present invention.

Referring to FIG. 10, the common driver 212M may generate a preliminary driving signal P_DRV according to a voltage at a first node ND_V1. The common driver 212M may include a feedback circuit 332, a comparator 334, a first repeater RP10, and a first level shifter LS5. The first level shifter LS5 may shift a level of an output signal of the first repeater RP10 to a pull-up driving voltage (VSAP) level to output a preliminary driving signal P_DRV. The first level shifter LS5 may convert the output signal swinging between a source voltage (VDD) level and a ground voltage (VSS) level, into the preliminary driving signal P_DRV swinging between the pull-up driving voltage (VSAP) level and the ground voltage (VSS) level.

In a sub-hole area S/H of each of the cell mat areas MA0 to MAn, a plurality of individual drivers 214_0 to 214_n may be disposed. The individual drivers 214_0 to 214_n may provide the core voltage VCORE_L to a sense amplifying circuit BLSA of a corresponding one of the cell mats MAT0 to MATn, according to the preliminary driving signal P_DRV. For example, the first individual driver 214_0 may include a level shifting circuit 352, a pull-up driver PU_D7, and a switch SW10. The level shifting circuit 352 may output a control signal CTRL0 by shifting or converting the source voltage (VDD) level when a first mat select signal MSEL0 and a pull-up driving signal SAP are activated. The level shifting circuit 352 may output a main driving signal M_DRV based on the control signal CTRL0 and the preliminary driving signal P_DRV. The pull-up driver PU_D7 may be coupled between a source voltage (VDD) terminal and the second node ND_V2 to receive the main driving signal M_DRV through its gate. The switch SW10 may couple the first node ND_V1 to the second node ND_V2 according to the control signal CTRL0. The second node ND_V2 may be coupled to a pull-up power line RTO. The first individual driver 214_0 may further include a pull-down driver PD_D4 for driving a pull-down power line SB with the ground voltage VSS according to a pull-down driving signal SAN.

In detail, the level shifting circuit 352 may include a second level shifter LS6, a logic circuit LG2, and a second repeater RP11. The second level shifter LS6 may shift the source voltage (VDD) level as the control signal CTRL0 when the first mat select signal MSEL0 and the pull-up driving signal SAP are activated. For reference, in FIG. 10, the numeral reference SAP_MSEL # (wherein # is an integer from 0 to n) denotes a signal activated to a logic high level when the corresponding mat select signal MSEL # and the pull-up driving signal SAP are activated. Depending on an embodiment, logic gates for performing a logic AND operation on the corresponding mat select signal MSEL # and the pull-up driving signal SAP may be provided. The logic circuit LG2 may perform a logic AND operation on the control signal CTRL0 and the preliminary driving signal P_DRV. The second repeater RP11 may buffer an output signal of the logic circuit LG2 to output the main driving signal M_DRV. Preferably, the second repeater RP11 may include an even number of inverters.

FIG. 10 shows the logic circuit LG2 which is implemented with a second NAND gate ND2 for performing a NAND operation on the control signal CTRL0 and the preliminary driving signal P_DRV, and a second inverter INV2 for inverting an output of the second NAND gate ND2. However, the present invention is not limited to this configuration; the logic circuit LG2 may be implemented with any of various types of logic gates for performing an AND operation.

A precharge circuit 356, a plurality of cell mats MAT0 to MATn, and a sense amplifying circuit BLSA may have substantially the same configuration as those of FIG. 1; thus, detailed description thereof is omitted here.

For reference, the level shifter LS4 is disposed after, i.e., downstream, the logic circuit LG1 in the semiconductor memory device 200 of FIG. 8, but the first and second level shifters LS5 and LS6 are disposed prior to the logic circuit LG2 in the semiconductor memory device 300 of FIG. 10. Since operation of the semiconductor memory device 300 may be substantially the same as that of the semiconductor memory device 200, detailed description thereof is omitted here.

In the above embodiments, the individual drivers 214_0 to 214_n are disposed in the sub-hole area S/H of each of the cell mat areas MA0 to MAn. However, the present invention is not limited to this configuration; in another embodiment, the individual drivers 214_0 to 214_n may be disposed in a BLSA area of each of the cell mat areas MA0 to MAn, or may be distributed and disposed in an X-hole area. In addition, in the above embodiments, each of the individual drivers 214_0 to 214_n includes the level shifting circuit 252 or 352, the pull-up driver PU_D6 or PU_D7, the pull-down driver PD_D3 or PD_D4, and the switch SW0 or SW10. However, the present invention is not limited to this configuration. Depending on an embodiment, each of the individual drivers 214_0 to 214_n may include a level shifting circuit, a pull-up driver, and a pull-down driver while a switch may be separately disposed from the individual drivers 214_0 to 214_n.

As described above, in accordance with embodiments of the present invention, by disposing the core voltage supply circuit 212 in the core area 210, not in the peripheral area 220, the sense amplifying circuit BLSA may perform the bit line sensing operation using the local/internal core voltage VCORE_L provided from the more adjacently disposed core voltage supply circuit 212. Therefore, even without an over-driving operation, a stable operation is possible and performance can be improved at the same time. In addition, since the configurations of the core area 210 receive only the external source voltage VDD from the peripheral area 220, unnecessary wirings/interconnections can be removed to improve net-die efficiency and yield.

In addition, in accordance with embodiments of the present invention, the master driver 212M and the individual drivers 214_0 to 214_n are disposed in the core area 210, and particularly, the individual drivers 214_0 to 214_n are disposed in the sub-hole area S/H of each of the cell mat areas MA0 to MAn. That is, the semiconductor memory device 200 and 300 may perform the bit line sensing operation using the individual drivers 214_0 to 214_n configured by merging/integrating the plurality of slave drivers (i.e., drivers for the core voltage VCORE) and the pull-up drivers (i.e., drivers for the pull-up voltage of the pull-up power line RTO). Accordingly, it can improve the tRCD characteristics of a speed parameter, while minimizing the core area 210.

It should be noted that although the technical spirit of the present invention has been described in connection with embodiments thereof, the present invention may be implemented in other forms and ways as those skilled in the art will understand in light of the present disclosure. Thus, the present invention encompasses all such variations that fall within the scope of the claims.

For example, with respect to the logic gates and transistors provided as examples in the above-described embodiments, the invention may be implemented with different types of such components arranged in different configurations depending on the polarity of the input signal.

While the present disclosure has been illustrated and described with respect to specific embodiments, it will be apparent to those skilled in the art that various changes and modifications may be made without departing from the spirit and scope of the invention as defined in the following claims.

What is claimed is:

1. A semiconductor memory device comprising:
   a common driver configured to generate a preliminary driving signal according to a voltage at a first node; and
   a plurality of individual drivers configured to provide a core voltage to a sense amplifying circuit of a corresponding one of a plurality of cell mats, according to the preliminary driving signal,
   wherein each of the individual drivers includes:
   a level shifting circuit configured to output a main driving signal by shifting a level of the preliminary driving signal when a corresponding mat select signal and a pull-up driving signal are activated, wherein the level shifting circuit includes: a logic circuit configured to perform a logic AND operation on the corresponding mat select signal, the pull-up driving signal and the preliminary driving signal, and a level shifter configured to shift a level of an output signal of the logic circuit;
   a pull-up driver configured to drive a pull-up power line with the core voltage according to the main driving signal; and
   a switch configured to couple the first node to the pull-up power line when the corresponding mat select signal and the pull-up driving signal are activated.

2. The semiconductor memory device of claim 1, wherein each of the individual drivers further includes:

a pull-down driver configured to drive a pull-down power line with a ground voltage according to a pull-down driving signal.

3. The semiconductor memory device of claim 2, wherein the sense amplifying circuit is coupled to the pull-up power line and the pull-down power line to sense and amplify data of bit lines.

4. The semiconductor memory device of claim 1, wherein the common driver and the individual drivers are disposed in a core area.

5. The semiconductor memory device of claim 1, wherein the individual drivers are disposed in a sub-hole area of each of the cell mats.

6. A semiconductor memory device comprising:
a common driver configured to generate a preliminary driving signal according to a voltage at a first node, wherein the common driver includes: a comparator configured to output the preliminary driving signal by comparing a voltage at the first node with a reference voltage, and a first level shifter configured to shift a level of the preliminary driving signal; and
a plurality of individual drivers configured to provide a core voltage to a sense amplifying circuit of a corresponding one of a plurality of cell mats, according to the preliminary driving signal,
wherein each of the individual drivers includes:
a level shifting circuit configured to output a control signal by shifting a source voltage level when a corresponding mat select signal and a pull-up driving signal are activated, and output a main driving signal based on the control signal and the preliminary driving signal;
a pull-up driver configured to drive a pull-up power line with the core voltage according to the main driving signal; and
a switch configured to couple the first node to the pull-up power line according to the control signal.

7. The semiconductor memory device of claim 6, wherein each of the individual drivers further includes:
a pull-down driver configured to drive a pull-down power line with a ground voltage according to a pull-down driving signal.

8. The semiconductor memory device of claim 7, wherein the sense amplifying circuit is coupled to the pull-up power line and the pull-down power line to sense and amplify data of bit lines.

9. The semiconductor memory device of claim 6, wherein the common driver and the individual drivers are disposed in a core area.

10. The semiconductor memory device of claim 6, wherein the individual drivers are disposed in a sub-hole area of each of the cell mats.

11. A semiconductor memory device comprising:
a common driver configured to generate a preliminary driving signal according to a voltage at a first node; and
a plurality of individual drivers configured to provide a core voltage to a sense amplifying circuit of a corresponding one of a plurality of cell mats, according to the preliminary driving signal,
wherein each of the individual drivers includes:
a level shifting circuit configured to output a control signal by shifting a source voltage level when a corresponding mat select signal and a pull-up driving signal are activated, and output a main driving signal based on the control signal and the preliminary driving signal,
wherein the level shifting circuit includes:
a second level shifter configured to shift the source voltage level to output the control signal when the corresponding mat select signal and the pull-up driving signal are activated, and
a logic circuit configured to preform a logic AND operation on the control signal and the preliminary driving signal;
a pull-up driver configured to drive a pull-up power line with the core voltage according to the main driving signal; and
a switch configured to couple the first node to the pull-up power line according to the control signal.

12. A semiconductor memory device comprising:
a plurality of cell mats including a plurality of memory cells at intersections of word lines and bit lines;
a plurality of sense amplifying circuits configured to sense and amplify data of the bit lines of a corresponding cell mat;
a common driver configured to generate a preliminary driving signal according to a voltage at a first node;
a plurality of individual drivers configured to generate a main driving signal by shifting a level of the preliminary driving signal when a corresponding mat select signal and a pull-up driving signal are activated, and provide a pull-up voltage and a pull-down voltage to a corresponding sense amplifying circuit according to the main driving signal and a pull-down driving signal; and
a plurality of switches configured to couple the first node to a pull-up power line when the corresponding mat select signal and the pull-up driving signal are activated,
wherein each of the individual drivers includes:
a logic circuit configured to perform a logic AND operation on the corresponding mat select signal, the pull-up driving signal and the preliminary driving signal; and
a level shifter configured to shift a level of an output signal of the logic circuit to output the main driving signal.

13. The semiconductor memory device of claim 12, wherein each of the individual drivers further includes:
a pull-up driver configured to drive the pull-up power line with the pull-up voltage according to the main driving signal; and
a pull-down driver configured to drive a pull-down power line with the pull-down voltage according to the pull-down driving signal.

* * * * *